United States Patent
Topping et al.

(10) Patent No.: US 11,835,868 B2
(45) Date of Patent: Dec. 5, 2023

(54) PROTECTIVE COATING FOR ELECTROSTATIC CHUCKS

(71) Applicant: Lam Research Corporation, Fremont, CA (US)

(72) Inventors: Stephen Topping, Portland, OR (US); Vincent Burkhart, Cupertino, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 17/369,694

(22) Filed: Jul. 7, 2021

(65) Prior Publication Data

US 2021/0333715 A1 Oct. 28, 2021

Related U.S. Application Data

(62) Division of application No. 15/926,349, filed on Mar. 20, 2018, now Pat. No. 11,086,233.

(51) Int. Cl.
*H01L 21/683* (2006.01)
*G03F 7/00* (2006.01)

(52) U.S. Cl.
CPC .......... *G03F 7/707* (2013.01); *H01L 21/6831* (2013.01); *H01L 21/6833* (2013.01)

(58) Field of Classification Search
CPC .... G03F 7/707; G03F 7/70708; G03F 7/7095; H01L 21/6831; H01L 21/6833; H01L 21/6875; H01L 21/68757; H01L 21/6835; B23Q 3/15; H02N 13/00
See application file for complete search history.

(56) References Cited

U.S. PATENT DOCUMENTS

| | | | |
|---|---|---|---|
| 4,692,836 A | 9/1987 | Suzuki | |
| 5,463,526 A * | 10/1995 | Mundt | C23C 28/00 |
| | | | 361/230 |
| 5,507,874 A * | 4/1996 | Su | B08B 7/0035 |
| | | | 118/723 VE |
| 5,560,780 A | 10/1996 | Wu et al. | |
| 5,633,073 A * | 5/1997 | Cheung | C23C 16/5096 |
| | | | 428/209 |
| 5,737,178 A * | 4/1998 | Herchen | H02N 13/00 |
| | | | 361/234 |

(Continued)

FOREIGN PATENT DOCUMENTS

| | | |
|---|---|---|
| CN | 101495670 A | 7/2009 |
| CN | 106148915 A | 11/2016 |

(Continued)

OTHER PUBLICATIONS

International Search Report dated Mar. 13, 2019 from International Application No. PCT/US2019/022046.

(Continued)

*Primary Examiner* — Yusef A Ahmed
(74) *Attorney, Agent, or Firm* — Weaver Austin Villeneuve & Sampson LLP

(57) ABSTRACT

An ElectroStatic Chuck (ESC) including a chucking surface having at least a portion covered with a coating of silicon oxide ($SiO_2$), silicon nitride ($Si_3N_4$) or a combination of both. The coating can be applied in situ a processing chamber of a substrate processing tool and periodically removed and re-applied in situ to create fresh coating.

7 Claims, 6 Drawing Sheets

(56) References Cited

U.S. PATENT DOCUMENTS

| | | | |
|---|---|---|---|
| 5,812,362 A * | 9/1998 | Ravi | H01L 21/6875 279/128 |
| 5,829,791 A | 11/1998 | Kotsubo et al. | |
| 5,841,624 A * | 11/1998 | Xu | H02N 13/00 279/128 |
| 5,942,282 A * | 8/1999 | Tada | C23C 16/34 427/253 |
| 6,066,836 A | 5/2000 | Chen et al. | |
| 6,072,685 A | 6/2000 | Herchen | |
| 6,081,414 A * | 6/2000 | Flanigan | H01J 37/32532 279/128 |
| 6,104,596 A | 8/2000 | Hausmann | |
| 6,151,203 A | 11/2000 | Shamouilian et al. | |
| 6,213,478 B1 | 4/2001 | Nishikawa | |
| 6,221,221 B1 | 4/2001 | Al-Shaikh et al. | |
| 6,239,403 B1 | 5/2001 | Dible et al. | |
| 6,261,977 B1 * | 7/2001 | Tsai | H01L 21/6833 438/798 |
| 6,403,491 B1 | 6/2002 | Liu et al. | |
| 6,466,881 B1 | 10/2002 | Shih et al. | |
| 6,592,709 B1 | 7/2003 | Lubomirsky | |
| 6,776,892 B1 | 8/2004 | Ritzdorf et al. | |
| 6,858,265 B2 * | 2/2005 | Redeker | H01L 21/6831 427/574 |
| 6,879,051 B1 * | 4/2005 | Singh | C23C 16/045 257/762 |
| 7,625,227 B1 | 12/2009 | Henderson et al. | |
| 9,213,021 B2 | 12/2015 | Plant et al. | |
| 9,850,573 B1 * | 12/2017 | Sun | H01J 37/32495 |
| 10,079,154 B1 * | 9/2018 | Le | H01L 21/31116 |
| 10,147,610 B1 | 12/2018 | Lingampalli et al. | |
| 10,403,535 B2 | 9/2019 | Ye et al. | |
| 10,431,467 B2 | 10/2019 | Lingampalli et al. | |
| 10,937,684 B2 * | 3/2021 | Horiuchi | B05D 7/52 |
| 11,086,233 B2 * | 8/2021 | Topping | G03F 7/707 |
| 11,183,368 B2 | 11/2021 | French et al. | |
| 11,289,355 B2 | 3/2022 | Gomm | |
| 11,469,084 B2 | 10/2022 | Thomas et al. | |
| 2001/0019472 A1 | 9/2001 | Kanno et al. | |
| 2001/0027972 A1 | 10/2001 | Yamaguchi et al. | |
| 2003/0051665 A1 | 3/2003 | Zhao et al. | |
| 2003/0180459 A1 * | 9/2003 | Redeker | H01L 21/6831 427/248.1 |
| 2004/0074869 A1 * | 4/2004 | Wang | C23F 4/00 257/E21.256 |
| 2004/0137169 A1 * | 7/2004 | Carollo | H01L 21/0217 257/E21.268 |
| 2005/0042881 A1 * | 2/2005 | Nishimoto | H01L 21/6833 361/234 |
| 2005/0183669 A1 * | 8/2005 | Parkhe | H01L 21/6831 118/724 |
| 2005/0191827 A1 * | 9/2005 | Collins | H01J 37/32082 438/513 |
| 2005/0213279 A1 | 9/2005 | Hayakawa | |
| 2005/0274324 A1 | 12/2005 | Takahashi et al. | |
| 2006/0005930 A1 | 1/2006 | Ikeda et al. | |
| 2006/0011611 A1 | 1/2006 | Goto et al. | |
| 2006/0081558 A1 * | 4/2006 | Collins | H01J 37/321 134/1.1 |
| 2006/0120011 A1 * | 6/2006 | Handa | H01L 21/67109 361/234 |
| 2006/0158821 A1 * | 7/2006 | Miyashita | H01L 21/683 361/233 |
| 2006/0237442 A1 | 10/2006 | Goto et al. | |
| 2006/0280875 A1 | 12/2006 | Tomita et al. | |
| 2007/0141729 A1 | 6/2007 | Dhindsa et al. | |
| 2007/0223173 A1 | 9/2007 | Fujisawa et al. | |
| 2007/0253139 A1 * | 11/2007 | Nakano | B32B 27/36 361/234 |
| 2007/0256786 A1 * | 11/2007 | Zhou | H01J 37/32477 156/345.34 |
| 2008/0009417 A1 * | 1/2008 | Lou | H01L 21/68757 505/100 |
| 2008/0029032 A1 * | 2/2008 | Sun | H01L 21/68757 156/914 |
| 2008/0037195 A1 * | 2/2008 | Himori | H01L 21/6833 361/234 |
| 2008/0062609 A1 | 3/2008 | Himori et al. | |
| 2008/0167720 A1 | 7/2008 | Melkent | |
| 2008/0236493 A1 | 10/2008 | Sakao | |
| 2008/0258411 A1 | 10/2008 | Miura et al. | |
| 2009/0284894 A1 * | 11/2009 | Cooke | H01L 21/6833 438/700 |
| 2009/0314208 A1 | 12/2009 | Zhou et al. | |
| 2010/0039747 A1 * | 2/2010 | Sansoni | H01L 21/67103 361/234 |
| 2010/0104852 A1 * | 4/2010 | Fletcher | G03F 7/0002 428/338 |
| 2010/0126847 A1 | 5/2010 | Dhindsa et al. | |
| 2010/0323124 A1 * | 12/2010 | Vartabedian | H01J 37/321 118/723 R |
| 2011/0031217 A1 | 2/2011 | Himori | |
| 2011/0096461 A1 | 4/2011 | Yoshikawa et al. | |
| 2012/0044609 A1 * | 2/2012 | Cooke | H01L 21/6831 361/234 |
| 2012/0164834 A1 | 6/2012 | Jennings et al. | |
| 2012/0247678 A1 | 10/2012 | Takahashi et al. | |
| 2013/0070384 A1 * | 3/2013 | Cooke | H02N 13/00 427/535 |
| 2013/0087447 A1 * | 4/2013 | Bodke | C23C 14/046 204/192.15 |
| 2013/0126206 A1 | 5/2013 | Zhou et al. | |
| 2013/0155569 A1 * | 6/2013 | Suuronen | H01L 21/6833 361/234 |
| 2014/0048720 A1 | 2/2014 | Hayakawa et al. | |
| 2014/0087587 A1 | 3/2014 | Lind | |
| 2014/0118880 A1 * | 5/2014 | He | C23C 16/30 361/236 |
| 2014/0154465 A1 * | 6/2014 | Sun | H01L 21/6831 156/89.12 |
| 2014/0159325 A1 * | 6/2014 | Parkhe | H01L 21/67109 156/154 |
| 2014/0177123 A1 * | 6/2014 | Thach | H01L 21/67103 361/234 |
| 2014/0203526 A1 * | 7/2014 | Banda | B28D 5/0082 279/128 |
| 2014/0334060 A1 * | 11/2014 | Parkhe | H01L 21/6831 156/60 |
| 2014/0355169 A1 * | 12/2014 | Maeta | H01L 21/6831 361/234 |
| 2014/0356538 A1 * | 12/2014 | Schmitt | G03G 15/2025 427/259 |
| 2015/0044947 A1 * | 2/2015 | Lu | B24B 37/044 451/41 |
| 2015/0116889 A1 | 4/2015 | Yamasaki et al. | |
| 2015/0179412 A1 | 6/2015 | Chhatre et al. | |
| 2015/0228528 A1 * | 8/2015 | Behdjat | H01L 21/6875 219/444.1 |
| 2015/0241783 A1 * | 8/2015 | Carcasi | G03F 7/30 430/324 |
| 2015/0311043 A1 * | 10/2015 | Sun | C23C 4/11 427/523 |
| 2015/0311105 A1 | 10/2015 | Sadjadi et al. | |
| 2015/0311108 A1 * | 10/2015 | Horiuchi | H01L 21/6875 269/302 |
| 2015/0323050 A1 | 11/2015 | Ohno | |
| 2015/0371876 A1 | 12/2015 | Terauchi et al. | |
| 2016/0002779 A1 | 1/2016 | Lin et al. | |
| 2016/0064264 A1 * | 3/2016 | Kulshreshtha | H01L 21/6833 438/791 |
| 2016/0090650 A1 * | 3/2016 | Qian | C23C 16/45544 427/9 |
| 2016/0111315 A1 * | 4/2016 | Parkhe | H01L 21/6831 361/234 |
| 2016/0196984 A1 * | 7/2016 | Lill | H01J 37/32715 438/723 |
| 2016/0281230 A1 * | 9/2016 | Varadarajan | C23C 16/4404 |
| 2016/0333475 A1 | 11/2016 | Gomm et al. | |
| 2016/0336210 A1 * | 11/2016 | Cooke | H01L 21/67248 |
| 2016/0336213 A1 | 11/2016 | Gomm et al. | |

(56) References Cited

U.S. PATENT DOCUMENTS

| | | | |
|---|---|---|---|
| 2016/0340781 A1 | 11/2016 | Thomas et al. | |
| 2016/0343600 A1* | 11/2016 | Parkhe | H01J 37/32477 |
| 2016/0372307 A1 | 12/2016 | Yang et al. | |
| 2017/0018411 A1 | 1/2017 | Sriraman et al. | |
| 2017/0040148 A1 | 2/2017 | Augustino et al. | |
| 2017/0103908 A1* | 4/2017 | Lew | H01L 21/68757 |
| 2017/0110358 A1 | 4/2017 | Sadjadi et al. | |
| 2017/0110385 A1 | 4/2017 | Kawajiri et al. | |
| 2017/0140970 A1* | 5/2017 | Boyd, Jr. | C03C 17/00 |
| 2017/0256431 A1* | 9/2017 | Parkhe | H01L 21/67109 |
| 2018/0025891 A1 | 1/2018 | Marakhtanov et al. | |
| 2018/0061684 A1* | 3/2018 | Parkhe | H01L 21/67011 |
| 2018/0096869 A1* | 4/2018 | Yoshida | H01L 21/6831 |
| 2018/0112311 A1* | 4/2018 | Fenwick | C23C 16/34 |
| 2018/0308738 A1* | 10/2018 | Tobe | H01L 21/6833 |
| 2018/0318890 A1* | 11/2018 | Yasseri | B08B 3/14 |
| 2018/0350568 A1 | 12/2018 | Mitsumori et al. | |
| 2018/0350649 A1 | 12/2018 | Gomm | |
| 2019/0019713 A1* | 1/2019 | Hidaka | C04B 35/6261 |
| 2019/0067076 A1 | 2/2019 | Zvokelj | |
| 2019/0071778 A1 | 3/2019 | Thomas et al. | |
| 2019/0115241 A1* | 4/2019 | Vellore | H01L 21/6831 |
| 2019/0136373 A1* | 5/2019 | Yeh | H01J 37/32449 |
| 2019/0157052 A1* | 5/2019 | Doan | B08B 7/0071 |
| 2019/0218663 A1* | 7/2019 | Funakubo | C23C 16/45525 |
| 2019/0221406 A1* | 7/2019 | Funakubo | H01L 21/31144 |
| 2019/0237341 A1* | 8/2019 | Yu | H01L 21/32136 |
| 2019/0237353 A1* | 8/2019 | Thomas | H01L 21/68792 |
| 2019/0267268 A1* | 8/2019 | Abel | H01J 37/3299 |
| 2019/0276366 A1* | 9/2019 | Sun | C04B 35/505 |
| 2019/0294050 A1* | 9/2019 | Topping | G03F 7/7095 |
| 2019/0341289 A1* | 11/2019 | Parkhe | H01L 21/68785 |
| 2019/0355556 A1 | 11/2019 | Takahashi | |
| 2020/0013590 A1* | 1/2020 | Liu | H01L 21/0262 |
| 2020/0043703 A1 | 2/2020 | French et al. | |
| 2020/0340102 A1 | 10/2020 | Kimura et al. | |
| 2021/0043490 A1 | 2/2021 | Vasquez et al. | |
| 2021/0071300 A1* | 3/2021 | Bajaj | H01J 37/32467 |
| 2021/0265138 A1 | 8/2021 | Ikeda et al. | |
| 2021/0340668 A1* | 11/2021 | Macpherson | C23C 16/401 |
| 2022/0044909 A1 | 2/2022 | French et al. | |
| 2022/0181127 A1* | 6/2022 | Erickson | H01J 37/32697 |
| 2022/0181184 A1 | 6/2022 | Gomm | |
| 2022/0415620 A1 | 12/2022 | Thomas et al. | |

FOREIGN PATENT DOCUMENTS

| | | |
|---|---|---|
| CN | 106148916 A | 11/2016 |
| EP | 2015343 A2 | 1/2009 |
| JP | H07201496 A | 8/1995 |
| JP | H08154387 A | 6/1996 |
| JP | H09176860 A | 7/1997 |
| JP | H09213778 A | 8/1997 |
| JP | 2001237051 A | 8/2001 |
| JP | 2002512448 A | 4/2002 |
| JP | 2003124296 A | 4/2003 |
| JP | 2003160874 A | 6/2003 |
| JP | 2004095722 A | 3/2004 |
| JP | 2005018992 A | 1/2005 |
| JP | 2005072286 A | 3/2005 |
| JP | 2005347620 A | 12/2005 |
| JP | 2006302887 A | 11/2006 |
| JP | 4034145 B2 | 1/2008 |
| JP | 2008270197 A | 11/2008 |
| JP | 2009123929 A | 6/2009 |
| JP | 2009256789 A | 11/2009 |
| JP | 2010109316 A | 5/2010 |
| JP | 2011049428 A | 3/2011 |
| JP | 2011061040 A | 3/2011 |
| JP | 2014038928 A | 2/2014 |
| JP | 2014505362 A | 2/2014 |
| JP | 2014082449 A | 5/2014 |
| JP | 2016213456 A | 12/2016 |
| JP | 2016213463 A | 12/2016 |
| JP | 2017055100 A | 3/2017 |
| JP | 2017228526 A | 12/2017 |
| JP | 2018117024 A | 7/2018 |
| KR | 20050115940 A | 12/2005 |
| KR | 20060050341 A | 5/2006 |
| KR | 20080077202 A | 8/2008 |
| KR | 20090081717 A | 7/2009 |
| KR | 101333631 B1 | 11/2013 |
| KR | 20140097312 A | 8/2014 |
| KR | 10-1465640 | 11/2014 |
| KR | 20150099400 A | 8/2015 |
| KR | 20160000400 A | 1/2016 |
| KR | 20160127717 A | 11/2016 |
| KR | 20170042359 A | 4/2017 |
| KR | 20170054239 A | 5/2017 |
| KR | 20180000291 A | 1/2018 |
| KR | 20180011711 A | 2/2018 |
| TW | 200402095 A | 2/2004 |
| TW | 201119524 A | 6/2011 |
| TW | 201525184 A | 7/2015 |
| TW | 201535453 A | 9/2015 |
| TW | 201535588 A | 9/2015 |
| WO | WO-2010087385 A1 | 8/2010 |
| WO | WO-2011099481 A1 | 8/2011 |
| WO | WO-2012087737 A2 | 6/2012 |
| WO | WO-2013162820 A1 | 10/2013 |
| WO | WO-2014057771 A1 | 4/2014 |
| WO | WO-2015105647 A1 | 7/2015 |

OTHER PUBLICATIONS

Written Opinion dated Mar. 13, 2019 from International Application No. PCT/US2019/022046.
European Extended Search Report dated Feb. 8, 2021 issued in Application No. EP 188093256.
Final Office Action dated Apr. 30, 2020 issued in U.S. Appl. No. 15/612,423.
Final Office Action dated Mar. 25, 2021 issued in U.S. Appl. No. 15/612,423.
International Preliminary Report on Patentability dated Aug. 13, 2020 issued in Application No. PCT/US2019/015865.
International Preliminary Report on Patentability dated Dec. 12, 2019 issued in Application No. PCT/US2018/034998.
International Preliminary Report on Patentability dated Mar. 10, 2020 issued in Application No. PCT/US2018/049267.
International Preliminary Report on Patentability dated Feb. 2, 2021, in Application No. PCT/US2019/044113.
International Search Report and Written Opinion dated May 17, 2019 issued in Application No. PCT/US2019/015865.
International Search Report and Written Opinion dated Sep. 6, 2018 issued in Application No. PCT/US2018/034998.
International Search Report and Written Opinion dated Dec. 19, 2019, in Application No. PCT/US2019/044113.
JP Office Action dated Jun. 14, 2022, in Application No. JP2019-566224 With English Translation.
Korean Office Action dated Jun. 7, 2021 issued in Application No. KR 10-2021-0056493.
KR Office Action and Search report dated Aug. 30, 2019 in Application No. KR10-2019-0073864 With English Translation.
KR Office Action dated Sep. 25, 2022 in Application No. KR10-2020-7000026.
KR Office Action dated Sep. 26, 2022 in Application No. KR10-2021-7033273.
KR Office Action dated Sep. 27, 2022, in Application No. KR10-2021-7033272.
KR Office Action dated Sep. 28, 2022 in Application No. KR10-2021-7032163.
KR Office Action dated Apr. 6, 2022, in Application No. KR1020217032163 with English translation.
KR Office Action dated Apr. 6, 2022, in Application No. KR1020217033272 with English translation.
KR Office Action dated Apr. 6, 2022, in Application No. KR1020217033273 with English translation.
KR Office Action dated Aug. 2, 2022 in Application No. KR10-2022-0034122 with English translation.

(56) References Cited

OTHER PUBLICATIONS

KR Office Action dated Aug. 30, 2019 in Application No. 10-2019-0073864.
KR Office Action dated Dec. 21, 2021, in Application No. KR10-2021-0056493 with English translation.
KR Office Action dated Mar. 23, 2022, in Application No. KR 10-2019-7037514 with English Translation.
KR Office Action dated May 6, 2022, in Application No. KR1020207000026.
KR Search Report (no translation provided) dated Aug. 1, 2019, in Application No. 10-2019-0073864.
Notice of Allowance dated Apr. 8, 2021 issued in U.S. Appl. No. 15/926,349.
Notice of Allowance dated Nov. 24, 2021 issued in U.S. Appl. No. 15/612,423.
Office Action dated Jan. 3, 2020 issued in U.S. Appl. No. 15/612,423.
Office Action dated Oct. 16, 2020 issued in U.S. Appl. No. 15/926,349.
Office Action dated Oct. 6, 2020 issued in U.S. Appl. No. 15/612,423.
PCT International Search Report and Written Opinion of the International Searching Authority issued in corresponding International Patent Application No. PCT/US2018/049267 dated Dec. 26, 2018 (Forms PCT/ISA/220, 210, 237) (12 total pages).
SG Office Action dated Mar. 2, 2022, in Application No. SG11201911409S.
Singapore Notice of Eligibility and Examination Report dated Mar. 2, 2022 issued in Application No. SG 11201911409S.
Singapore Search Report and Written Opinion dated Feb. 2, 2021 issued in Application No. SG 11201911409S.
TW Office Action dated Oct. 22, 2021, in application No. TW107118835 with English translation.
TW Office Action dated Sep. 30, 2022 in Application No. TW107130798 with English translation.
U.S. Final Office Action dated Jan. 19, 2022 issued in U.S. Appl. No. 15/696,068.
U.S. Final Office Action dated Sep. 14, 2020 issued in U.S. Appl. No. 15/696,068.
U.S. Notice of Allowance dated Jun. 1, 2022 in U.S. Appl. No. 15/696,068.
U.S. Notice of Allowance dated Jul. 23, 2021, issued in U.S. Appl. No. 16/052,877.
U.S. Office Action dated Apr. 28, 2020 issued in U.S. Appl. No. 15/696,068.
U.S. Office Action dated Jun. 30, 2021 issued in U.S. Appl. No. 15/696,068.
U.S. Office Action dated Apr. 15, 2021, issued in U.S. Appl. No. 16/052,877.
U.S. Appl. No. 17/823,744, inventor Thomas et al., filed Aug. 31, 2022.
U.S. Restriction Requirement dated Jan. 24, 2020 in U.S. Appl. No. 15/696,068.
CN Office Action dated Feb. 28, 2023 in Application No. 201880057283.X with English translation.
CN Office Action dated Mar. 18, 2023, in Application No. CN201880036474.8 with English translation.
JP Office Action dated Apr. 4, 2023, in Application No. JP2020-541696 with English translation.
JP Office Action dated Jun. 13, 2023 in Application No. JP2021-505710 with English translation.
JP Office Action dated Oct. 18, 2022, in Application No. JP2019-566224 With English Translation.
KR Office Action dated Sep. 28, 2022 in Application No. KR10-2021-7032163 with English translation.
KR Office Action dated Apr. 27, 2023 in Application No. KR10-2020-7030025 with English translation.
KR Office Action dated Feb. 3, 2023 in Application No. KR10-2021-7032163 with English translation.
KR Office Action dated Feb. 3, 2023 in Application No. KR10-2021-7033272 with English translation.
KR Office Action dated Feb. 23, 2023 in Application No. KR10-2020-7000026 with English translation.
KR Office Action dated Feb. 27, 2023, in Application No. KR10-2020-7025028 with English translation.
KR Office Action dated Jan. 31, 2023 in Application No. KR10-2021-7033273 with English translation.
KR Office Action dated Sep. 25, 2022 in Application No. KR10-2020-7000026 with English translation.
KR Office Action dated Sep. 26, 2022 in Application No. KR10-2021-7033273 with English translation.
KR Office Action dated Sep. 27, 2022, in Application No. KR10-2021-7033272 with English translation.
KR Search Report dated Aug. 1, 2019, in Application No. 10-2019-0073864 with English translation.
Schwartz, M., "Encyclopedia and Handbook of Materials, Parts, and Finishes", 3rd Edition, Glass-Ceramics Taylor & Francis, 2016, 27 pages.
TW Office Action dated May 30, 2023, in application No. TW108126884 with English translation.
U.S. Non-Final office Action dated Jan. 20, 2023 in U.S. Appl. No. 17/652,243.
U.S. Non-Final Office Action dated Jan. 19, 2023 in U.S. Appl. No. 16/966,833.
KR Office Action dated Jul. 20, 2023, in application No. KR10-2023-0039502 with English translation.
KR Office Action dated Jul. 21, 2023, in Application No. KR10-2022-7040239 with English Translation.
KR Office Action dated Jun. 26, 2023, in Application No. KR10-2020-7000026 with English translation.
TW Office Action dated Aug. 15, 2023, in application No. TW111140610 with English translation.
TW Office Action dated Aug. 18, 2023, in application No. TW107130798 with English translation.
U.S. Final office Action dated Aug. 7, 2023 in U.S. Appl. No. 16/966,833.
U.S. Notice of Allowance dated Jul. 11, 2023 in U.S. Appl. No. 17/652,243.
CN Office Action dated Oct. 9, 2023, in Application No. CN201980063428.1 with English translation.
KR Office Action dated Sep. 27, 2023, in application No. KR10-2020-7025028 with English translation.
U.S. Non-Final Office Action dated Sep. 25, 2023, in U.S. Appl. No. 17/823,744.
U.S. Notice of Allowance dated Oct. 17, 2023 in U.S. Appl. No. 17/652,243.
U.S. Appl. No. 18/481,886, inventors Gomm T A, et al., filed Oct. 5, 2023.

* cited by examiner

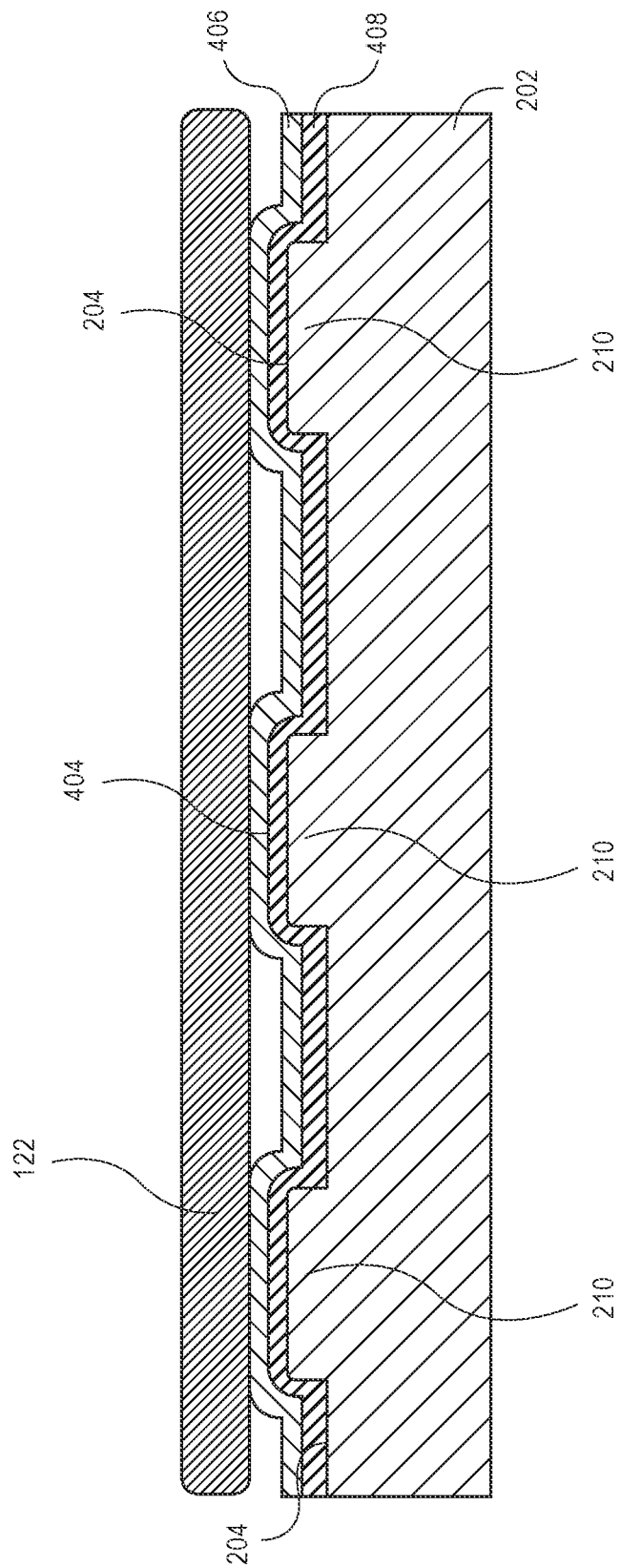

PROTECTIVE COATING FOR ELECTROSTATIC CHUCKS

CROSS-REFERENCE TO RELATED APPLICATION

This application is a Divisional of U.S. application Ser. No. 15/926,349, filed on Mar. 20, 2018, which is incorporated by reference herein in its entirety.

BACKGROUND

ElectroStatic Chucks (ESCs) are widely used in a variety of fabrication tools, such as thin film deposition, plasma etch, photo-resist striping, substrate cleaning as well as lithography, ion implantation, etc.

ESCs operate by applying a charge of one polarity onto a chucking surface and a charge of the opposite polarity on a substrate. Since opposite charges attract, the substrate is held or clamped in place by the resulting electrostatic force.

Coulombic and Johnsen-Rahbek ("J-R") are two types of ESCs that are commonly known. Both have a chucking surface that includes a dielectric formed over an electrode. With Coulombic ESCs, the dielectric is an insulator, whereas with J-R type chucks, the dielectric has a finite resistance (e.g., a bulk resistivity at room temperature ranging from $5.0^{e+15}$ to $5.0^{e+16}$ ohm-cm and at 550 degrees C. a bulk resistivity of $5.0^{e+8}$ to $5.0^{e+9}$ ohm-cm).

SUMMARY

An ElectroStatic Chuck (ESC) is disclosed. The ESC includes a pedestal having a chucking surface arranged to chuck a substrate. The chucking surface includes at least a portion covered with a coating of either silicon oxide ($SiO_2$), silicon nitride ($Si_3N_4$), or a combination of both.

Also disclosed is a method of depositing a coating onto a chucking surface of an ESC within a processing chamber of a substrate processing tool. In non-exclusive variations of this method, the deposited coating is either silicon oxide or silicon nitride, or a combination of both.

Further disclosed is a method for (a) using a halogen-based cleaning agent to remove a first coating formed on a chucking surface of an ESC pedestal and (b) depositing a second coating formed on the chucking surface of the ESC pedestal. By removing the first coating and replacing it with a second coating, the worn first coating can be refreshed with a fresh second coating. In non-exclusive variations of this method, the deposited coating is either silicon oxide or silicon nitride, or a combination of both.

In yet another embodiment, the aforementioned cleaning and coating may be performed in situ the processing chamber. For instance, during routine maintenance, a halogen-based cleaning agent may be used to remove unwanted deposits and particles that have collected on surfaces inside the processing chamber as a byproduct of substrate processing. Following the cleaning, a coating of silicon oxide and/or silicon nitride is then typically applied to the clean surfaces in a subsequent plasma deposition step. Since the cleaning and recoating sequence for the chucking surface of the ESC and the processing chamber are essentially the same, the chucking surface can be cleaned and recoated in situ the processing chamber at the same time as the processing chamber.

The use of silicon oxide and silicon nitride formed on the chucking surface of an ESC has a number of advantages. The coating can be used to protect the chucking surface from degradation and wear due to the shear lateral forces caused by different rates of thermal expansion between substrates and the chucking surface. The coating of silicon oxide and silicon nitride can be readily deposited and removed on the chucking surface in situ a processing chamber. As a result, an old worn coating can be removed and replaced with a new coating as needed or at fixed intervals, all inside the processing chamber.

In yet other non-exclusive embodiments, the coating applied to an ESC chuck can be either silicon oxide, silicon nitride, a combination of both silicon oxide and silicon nitride, or a multi-layer structure including one or more layers each of silicon oxide and silicon nitride.

BRIEF DESCRIPTION OF THE DRAWINGS

The present application and the advantages thereof, may best be understood by reference to the following description taken in conjunction with the accompanying drawings in which:

FIGS. 4A and 4B are enlarged, cross-sectional views of a substrate with different protective coatings in accordance with non-exclusive embodiments.

In the drawings, like reference numerals are sometimes used to designate like structural elements. It should also be appreciated that the depictions in the figures are diagrammatic and not necessarily to scale.

DETAILED DESCRIPTION

The present application will now be described in detail with reference to a few non-exclusive embodiments thereof as illustrated in the accompanying drawings. In the following description, numerous specific details are set forth in order to provide a thorough understanding of the present disclosure. It will be apparent, however, to one skilled in the art, that the present discloser may be practiced without some or all of these specific details. In other instances, well known process steps and/or structures have not been described in detail in order to not unnecessarily obscure the present disclosure.

ESCs, regardless of type, have several limitations. Fluorine is often used during the deposition of substrates, such as semiconductor wafers. The exposure of the clamping surface of an ESC to fluorine can introduce charge traps in the dielectric, negatively affecting its electrical properties, reducing the ability to clamp with sufficient force. Also, residual carbon, a by-product of many CVD processes, can also form on the clamping surface. Since carbon is an insulator, its presence on the clamping surface may interfere with the J-R type ESCs, also diminishing clamping strength.

It is known to use a Protective Electrostatic Cover (PEC) over the clamping surface of an ESC to prevent exposure to fluorine and/or residual carbon. The use of a PEC, however, creates a number of complications. A storage location within or adjacent the processing chamber is needed when the PEC is not in use. In addition, a mechanism is needed to move and position the PEC between its storage location and the ESC substrate. Such mechanisms tend to generate unwanted particles, require periodic maintenance, and often break. In addition, control software is needed to control the operation of the mechanism. Such control software tends to add complexity to the tool and increase development costs.

Figure 1:
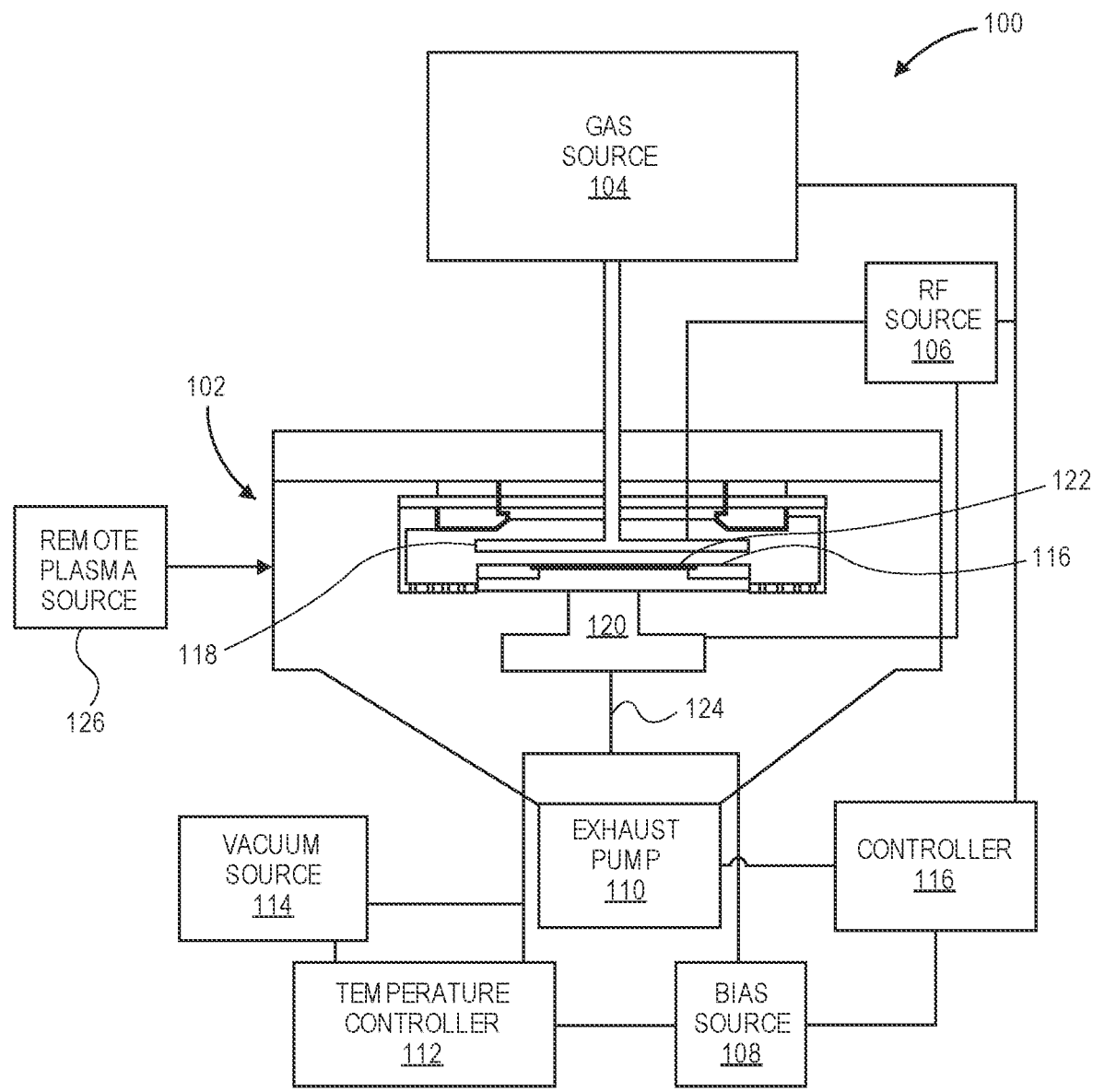
FIG. 1 is a block diagram of a substrate fabrication tool for processing a substrate in accordance with a non-exclusive embodiment.

FIG. 1 is a block diagram of a substrate processing tool 100 that may be used in a non-exclusive embodiment. The substrate processing tool 100, in this example, includes a processing chamber 102, a gas source 104, a Radio Frequency (RF) source 106, a bias source 108, an exhaust pump 110, a temperature controller 112, vacuum source 114 and a controller 116. The processing chamber 102 includes an electrode 118, coupled to the RF source 106, and an ElectroStatic Chuck (ESC) pedestal 120 for chucking a substrate 122.

During operation of the tool 100, a substrate 122 is chucked onto the ESC pedestal 120 within the processing chamber 102 containing a gas supplied by gas source 104. When RF power from RF source 106 is applied to electrode 118, a plasma for processing the substrate 122 within the processing chamber 102 is created. Depending on the type of tool, the plasma may be used to process the substrate 122 in a number of ways, including thin film deposition, etching, etc.

Although not illustrated, it should be noted that in alternative embodiments, the RF source 106 can be alternatively coupled to the pedestal 120. With this alternative embodiment, the pedestal 120 also acts as the electrode for generating the plasma within the processing chamber 102.

Also during operation, the controller 116 may selectively control a number of operations within the processing chamber 102, such as the bias applied to the substrate 122 via the bias source 108, the exhausting of the plasma or other gases out of the processing chamber 102 via the exhaust pump 110, the temperature of the pedestal 120 and/or the substrate 122 via the temperature controller 112 and the vacuum source 114. As each of these elements and their operation are well known, a detailed explanation is not provided herein for the sake of brevity.

In FIG. 1, the various electrical and/or tubing are provided between the various components 108 through 116 and processing chamber 102 and/or the pedestal 120. It should be noted that, for the sake of not over-complicating the details of the drawing, the various electrical and/or tubing connections as illustrated is simplified as a single connection 124. It is well understood that routing of the various electrical and tubing in and out of the processing chamber 102 and/or to the pedestal 120 is very complex, but is not addressed herein for the sake of brevity.

In one non-exclusive embodiment, tool 100 may include or operate in cooperation with a remote plasma source 126. A plasma generated in the remote plasma source 126 is supplied to the processing chamber 102. One possible reason to use a remote plasma generator is to reduce or eliminate the ion bombardment of surfaces within the processing chamber 102, which is typically undesired. For instance, in a non-exclusive embodiment, the remote plasma source 126 may be used for cleaning the processing chamber 102, which tends to increase the longevity of various surfaces and/or components within the processing chamber 102 by reducing their exposure ion bombardment, which typically accelerates degradation.

In alternative embodiments, the pedestal 120 is either a Coulombic and Johnsen-Rahbek ("J-R") type ESC.

In yet other embodiments, the pedestal 120 may be made of a number of thermally conductive materials. Such materials may include, but are not limited to aluminum nitride, aluminum oxide, ceramic, other thermally conductive materials, or any combination thereof.

The tool 100 can be one of several different types of Chemical Vapor Deposition (CVD) tools, such as a Low Pressure CVD (LPCVD), Ultra High Vacuum CVS (UHVCVD), a Plasma Enhanced CVD (PECVD), a Remote Plasma Enhanced CVD (RPECVD) or an Atomic Layer Deposition (ALDCVD). As each of these tools is well known, a detailed explanation is not provided herein for the sake of brevity. However, regardless of the type of CVD tool, the substrate 122 is typically exposed to one or more precursors, which react or decompose on the surface of the substrate 122, forming a desired deposition layer. By repeating this process multiple times, multiple layers can be formed on the surface of the substrate 122. It should be understood that this list of CVD tools provided herein is not exhaustive and should not be construed as limiting. On the contrary, the pedestal 120 as described herein may be used with any type of CVD tool or tool that is used to process a substrate.

Figure 2:
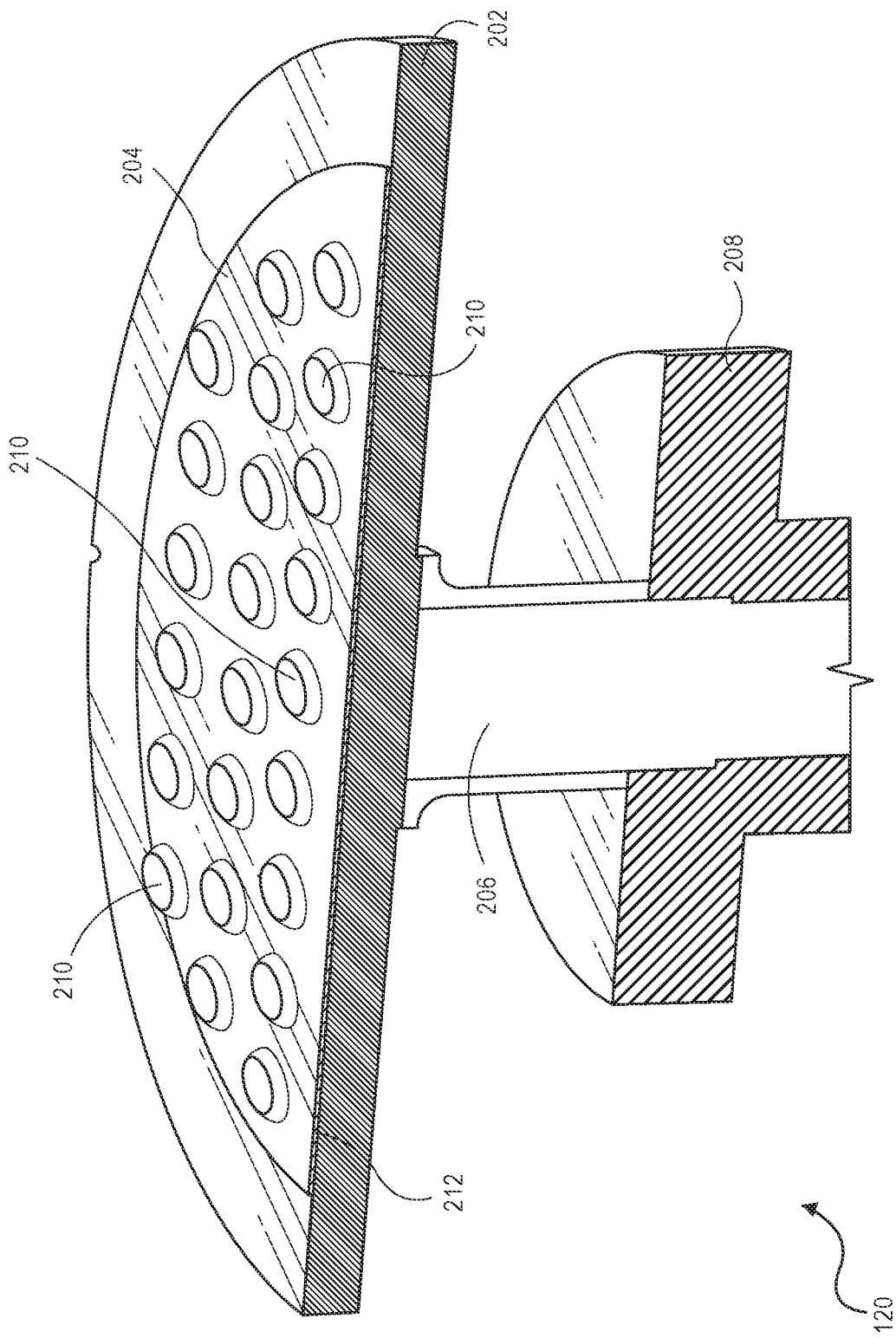
FIG. 2 is a perspective view of a cross-section of an electrostatic pedestal in accordance with a non-exclusive embodiment.

Referring to FIG. 2, a perspective, cross-sectional diagram of the ESC pedestal 120 is shown. The ESC pedestal 120 includes an ESC chuck 202 having a chucking surface 204 for chucking a substrate (not shown), a pedestal stem 206 that is arranged to support the ESC chuck 202 when mounted onto a recess provided in a pedestal mount 208.

The chucking surface 204 includes a plurality of raised Minimum Contact Areas (MCAs) 210. In a non-exclusive embodiment, the ESC chuck 202, chucking surface 204 and MCAs are made of aluminum nitride. At the operating temperatures (e.g., 400 to 650 degrees C.) commonly used in a CVD processing chamber, such as processing chamber 102, aluminum nitride has a finite resistance. As such, ESC pedestal 120 in this particular embodiment is a JR type ESC. In other embodiments, other materials may be used. With materials that are electric insulators, the ESC pedestal would be a Coulombic type ESC.

The MCAs 210 perform a number of functions. First, the MCAs 210 define the surface area in physical contact with the backside of the substrate 122 when chucked on surface 204. As a result, the charge transfer required to generate the clamping electrostatic force is concentrated in these locations. Second, the MCAs 210 reduce the amount of surface area of the backside of a substrate 122 in contact with the chucking surface 204. As a result, both metal contamination and current leakage is reduced.

In one particular embodiment, the MCAs 210 are round in shape, have a height of approximately 1 mill (0.001 of an inch), a diameter of approximately 0.028 of an inch (0.7112 millimeters) and a pitch of 0.015 inches (3.81 millimeters). It should be pointed out that FIG. 2 is not drawn to scale. For the sake of clarity, the MCAs 210 as shown are significantly larger relative to the chucking surface 204. In actual embodiments, the MCAs 210 would typically be smaller than illustrated.

The FIG. 2 embodiment is merely exemplary and should not be construed as limiting. In various other embodiments, the MCAs 210 may assume various shapes (e.g., square, rectangular, oval, polygon, etc.), may have a height taller or shorter, may vary in dimensions and pitch, and may cover a larger or smaller percentage of the chucking surface 204. In addition, the MCAs 210 may be arranged in a wide variety of arrangements (e.g., rows, columns, a specific pattern, etc.) on the chucking surface 204. In actual embodiments, the shape, height, pitch, surface area and pattern on the chucking surface 204 may widely vary and is at least partially dictated by a number of design constraints, such as the size of the substrate 122, the amount of clamping force needed, the type of tool 100, and a host of other engineering considerations.

The MCAs 210 and the substrate 122, such as a silicon wafer, are typically made of different materials. As a result, MCAs 210 and the backside of the substrate 122 will typically expand/contract at different rates with temperature changes incurred during clamping within the processing chamber 102. The different expansion/contraction rates create shear lateral forces across the top surfaces of the MCAs 210. Over time, these forces have been known to degrade the MCAs 210, changing surface roughness, reducing height, and altering their electrical properties, all of which tend to degrade the degree of electrostatic force generated at the chucking surface 204.

Conventional practice dictates that no material be deposited on the chucking surface 204 and/or MCAs 210 of an ESC 120. If such a material is present, charge traps will normally occur at or near the chucking surface, adversely affecting its electrical properties and interfering with the electrostatic charge clamping effect. Therefore, as a general rule, no material or coating is typically applied to or otherwise provided on the clamping surface with conventional ESCs.

Contrary to conventional practice, the Applicant proposes of silicon oxide ($SiO_2$) or silicon nitride ($Si_3N_4$) as a coating on the chucking surface 204 of the ESC 120. Electrons in both silicon oxide and silicon nitride become more excited at elevated temperatures. As a result, either of these materials (or a combination of both) becomes more conductive, and tends to act more like dielectric with finite resistance, at elevated temperatures in the range of 450 to 600 degrees C. Since this temperature range is often used in certain processing chamber of substrate processing tools, such as CVD tools, the Applicant has discovered that silicon oxide and/or silicon nitride can in fact be advantageously used on the chucking surface of an ESC.

The use of silicon oxide and silicon nitride formed on the chucking surface 204, including the MCAs 210, has a number of advantages:

(1) The coating can be used to protect the MCAs 210 from degradation and wear due to the shear lateral forces caused by different rates of thermal expansion of substrates 122 as noted above;

(2) The coating of silicon oxide and silicon nitride can be readily deposited and removed on the chucking surface 204 and/or MCAs 210 in situ the processing chamber 102. As a result, an old worn coating can be removed and replaced with a new coating as needed or at fixed intervals, all inside the processing chamber 102; and (3) Furthermore, the particle performance of processing chamber 102 can be improved by applying a coating onto the surfaces of the pedestal 120 and processing chamber 102. This coating adheres particles to theses surfaces of, reducing the likelihood of particle contamination on the substrate 122. The coating additionally provides a protective layer for any metal contamination on the chucking surface 204 of the pedestal 120, thereby minimizing metal contamination being transferred onto the substrates.

Figure 3:
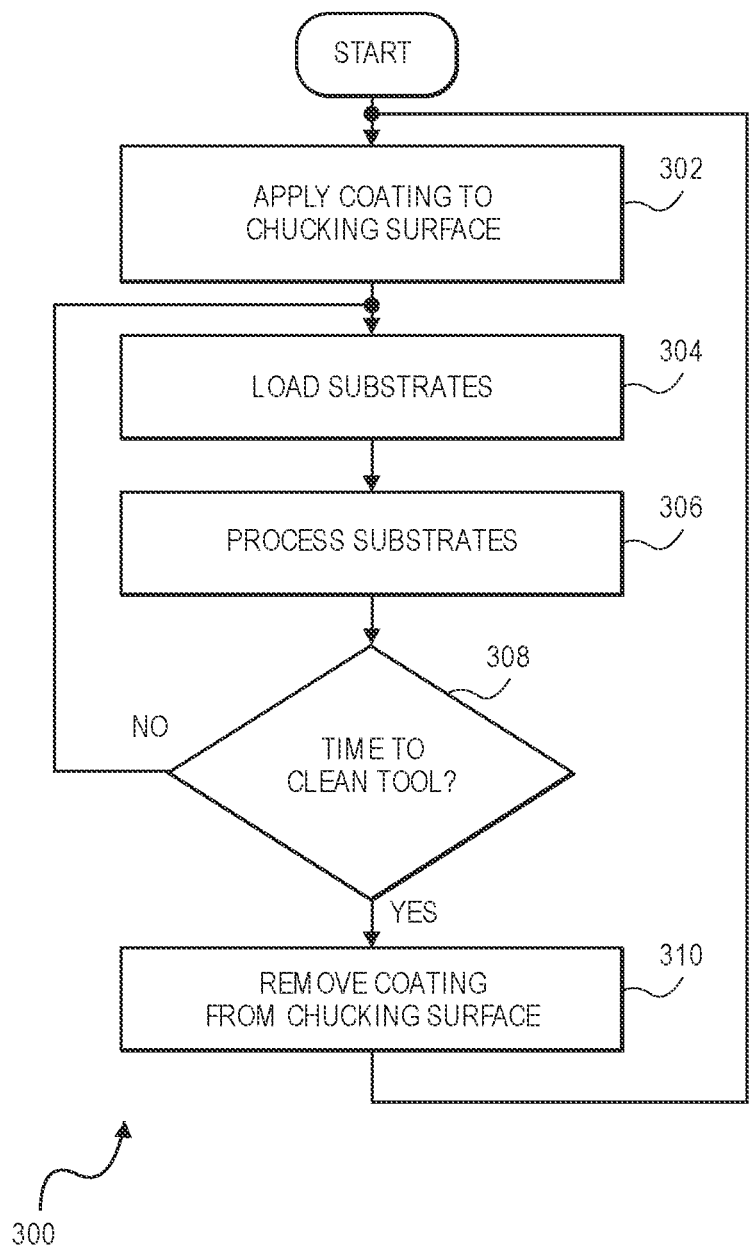
FIG. 3 a flow diagram illustrating steps for periodically applying in situ a coating to the chucking surface of an ESC within a processing chamber in accordance with a non-exclusive embodiment.

Referring to FIG. 3, a flow diagram 300 illustrating steps for periodically applying a coating to the chucking surface 204 of an ESC 120 in situ a processing chamber 102 is shown.

In the initial step 302, a coating of either silicon oxide or silicon nitride (or a combination of the two) is formed at least partially, including on the MCAs 210, of the chucking surface 204 of an ESC chuck 202. The coating is formed by introducing a silicon precursor and a reactant into the processing chamber 102. A chemical vapor deposition (CVD) plasma is then generated while the silicon precursor and the reactant are in the processing chamber. As a result, a coating is deposited or formed on the chucking surface 204.

In one embodiment, the coating is formed across the entire chucking surface 204, including the MCAs 210. In other embodiments, portions of the chucking surface 204 can be masked and the mask later removed after the coating is formed. As a result, the coating is provided only on the non-masked portions of the chucking surface 204.

In various embodiments, the silicon precursor or silicon source is selected from the group including (a) silane, (b) Tetraethyl Orthosilicate (TEOS), or a combination of both (a) and (b). The reactant is selected from the group including (a) oxygen ($O_2$), (b) nitrous oxide ($N_2O$), (c) ammonia (NH3), (d) nitrogen (N2) or any combination of (a) through (c). Once the precursor and the reactant are present in the processing chamber 102, the coating can be deposited during a CVD process.

The material make-up of the coating depends on the type of reactant used. With either silane or TEOS as a precursor, a silicon coating is grown or deposited on the chucking surface 204. If the reactant is an oxidizer, such as either oxygen or nitrous oxide, then the silicon coating is oxidized, resulting in silicon oxide. On the other hand if the reactant is ammonia or nitrogen, then silicon nitride results.

If both ammonia and oxygen and/or nitrous oxide is used as the reactant, then the resulting coating is a mix of both Silicon oxide and Silicon nitride.

Alternatively, by using one reactant initially and then later the other reactant, a multi-layered coating can be formed. For instance, by initially using oxygen and/or nitrous oxide and later ammonia, a multi-layered coating is formed with silicon oxide on the bottom and silicon nitride on the top. By swapping the sequence of the reactants, a complementary multi-layered structure can be created.

In step 304, substrates 122 are loaded into substrate processing tool 100 once the coating of desired material and thickness is formed in prior steps.

In step 306, the substrates 122 are processed in the processing chamber 102. The processing generally involves chucking a substrate 122 onto the chucking surface 204 of the ESC 120 and maintaining a temperature within the processing chamber within a predetermined range. As noted above, this range may be 400 to 650 degrees C. in one embodiment. In other embodiments, other ranges with higher or lower temperatures may be used. Once chucked, the substrate 122 is processed within the processing chamber 102. As noted above, the processing may involve thin film layer deposition, etching, photo-resist striping, substrate cleaning as well as lithography, ion implantation, etc.

In step 308, a decision is made if the processing chamber 102 needs to be cleaned or not. A number of factors may be used in making this decision. The decision can be based on an accumulated amount of processes conducted within the processing chamber 102 over a period of time. If the tool 102 is a CVD tool for instance, then cleaning intervals may be determined based on a specified amount of deposition material having been deposited on substrates 122 since the prior cleaning. Other decision factors may include time (e.g., the tool is cleaned at a periodic fixed interval) or after a predetermined number of substrates 122 have been processed, or any combination of these or other factors. If a decision is made to not clean the processing chamber 102, then steps 304 and/or 306 are repeated.

If a decision is made that it is time to clean the processing chamber 102, then a cleaning operation within the processing chamber 102, including the chucking surface 204, is performed as provided in step 310. The cleaning process generally involves using a halogen-based cleaning agent to remove the coating formed on a chucking surface 204 of the ESC 120 in situ within the processing chamber 102. A halogen-based cleaning agent, such as fluorine, nitrogen trifluoride or other fluorine contains gases, is introduced into the processing chamber 102. A plasma is then generated, which removes or etches away the coating on the chucking surface 204 and MCAs 210 along with other exposed surfaces, as is well known in the art.

Once the coating is removed, a new coating is formed on the chucking surface 204 and MCAs 210 as provided above in steps 302. Thereafter, steps 304 through 310 can be repeated over and over. With each cycle, an old, worn coating is removed in step 310 and a new, fresh coating is applied in step 302.

In yet another embodiment, the aforementioned cleaning and coating may be performed in situ the substrate processing tool during routine maintenance of the processing chamber 102. For instance, a halogen-based cleaning agent may be used from time-to-time to remove unwanted deposits and particles that have collected on surfaces inside the processing chamber 102 as a byproduct of substrate processing. Following the cleaning, a coating of silicon oxide and/or silicon nitride is then typically deposited to the clean surfaces within the processing chamber 102 in a subsequent plasma deposition step. Since the cleaning and recoating sequence for the chucking surface 204 of the pedestal 120 and the processing chamber 102 are essentially the same, both can be cleaned and recoated in situ the processing chamber 120 using the same cleaning and deposition sequence.

Figure 4A:
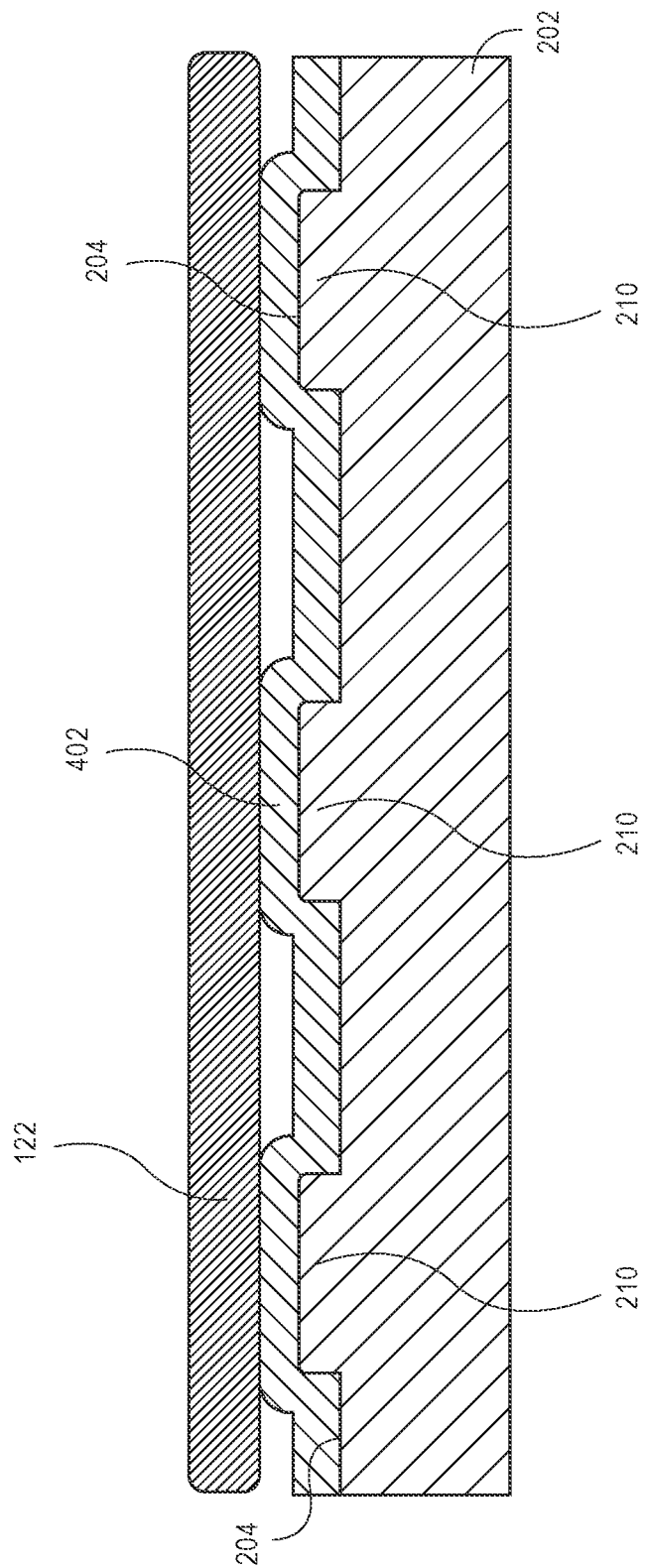

Referring to FIG. 4A, an enlarged, cross-sectional view of a substrate 122 on the chucking surface 204 of an ESC chuck 202 is shown. With this embodiment, a coating 402 is provided over and between the MCAs 210, covering the entire chucking surface 204. As previously noted, the coating 402 can be silicon oxide, silicon nitride or a combination of both.

Referring to FIG. 4B, another enlarged, cross-sectional view of a substrate 122 on the chucking surface 204 of an ESC chuck 202 is shown. With this embodiment, multi-layer coating 404 is provided over and between the MCAs, including top layer 406 and bottom layer 408. As previously noted, the top layer 406 can be silicon oxide and the bottom layer 408 silicon nitride or vice-versa.

Although the two embodiments of FIG. 4A and FIG. 4B show the coating 402/404 over the entire chucking surface 204 including MCAs 210, these diagrams as depicted should not be limiting. On the contrary, the coatings 402/404 can be only partially formed on the chucking surface 204, for instance, just on the top of the MCAs 210.

In yet other embodiments, the coating, regardless of whether it is a single layer (e.g., FIG. 4A) or multi-layer (e.g., FIG. 4B), is approximately 2.5 microns thick. In alternative embodiments, the coating may range in thickness from 1.0 to 5.0 microns or from 50 nanometers to 30 microns. With thicker coatings, such as 1.0 or more, with conventional CVD tools, thicker coating in the 1.0 to 5.0 micron range are typically applied. With other tools such as Atomic Layer Deposition (ALDCVD) tools, extremely thin coating of approximately 50 nanometers can be applied.

With certain substrate processing tools 100 that include or operate in cooperation with a remote plasma source 126 (as shown in FIG. 1), the various plasma used to either form or remove the coating(s) 402/404, as described above with regard to steps 302 and 310, can be generated remotely in remote plasma source 126 and then supplied into the processing chamber 102 including the ESC 120. The above-described steps of removing old coating and replacing with a fresh coating is otherwise more less the same as described above.

Silicon oxide and silicon nitride (or a combination of both) can be used on the chucking surface 204, at elevated temperatures, without adversely affecting the electrostatic forces needed to clamp a substrate 122. While a specific range is noted above, it should be understood that these temperatures should not be construed as limiting. On the contrary, any temperature may apply, provided the electrical conductivity of the silicon oxide or silicon nitride is increased to the level where the at least a portion of the chucking surface 204 coated with the Silicon oxide or Silicon nitride generates a sufficient electrostatic force to clamp the substrate.

The coating 402/404 also helps improve substrate clamping by solving a number of issues that plaque conventional electrostatic substrate chucks. For instance, the presence of carbon on a chucking surface of an electrostatic chuck is known to possibly cause electrical shorting, which tends to reduce the electrostatic clamping force between the chucking surface and the substrate. The above-described coating process, however, tends to remove the presence of carbon from the chucking surface. As a result, the incidence of electrical shorting is significantly reduced. In addition, the presence of fluorine within a processing chamber is known to penetrate certain types of chucking surfaces, such as those made of ceramic, creating charge-traps. However, the Applicant has found that at the processing temperatures of 450 to 600 degrees C. as described herein, the incidence of charge-traps is reduced. As a result, the electrostatic clamping force is not adversely affected.

Figure 5:
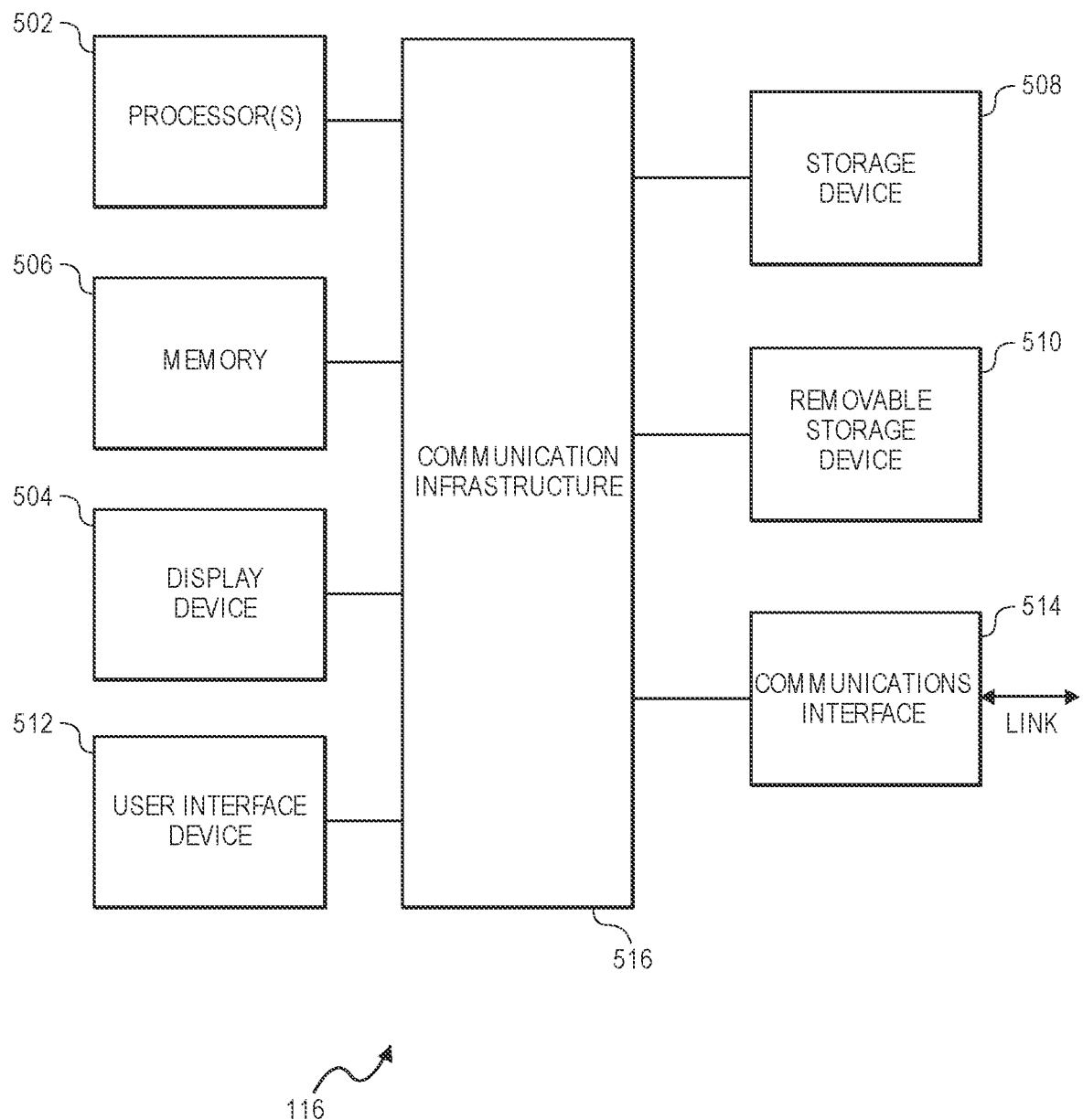
FIG. 5 is a block diagram of a computing system that may be configured as a controller for controlling the substrate fabrication tool in accordance with a non-exclusive embodiment.

Referring to FIG. 5, a block diagram of a computing system that may be configured as the controller 116 for controlling the substrate processing tool 100 in accordance with a non-exclusive embodiment is shown.

The controller 116 may have many physical forms ranging from a computer, server, a small handheld device up to a huge super computer. The controller 116 includes one or more processors 502, and further can include an electronic display device 504 (for displaying graphics, text, and other data), a main memory 506 (e.g., random access memory (RAM)), storage device 508 (e.g., hard disk drive), removable storage device 510 (e.g., optical disk drive), user interface devices 512 (e.g., keyboards, touch screens, keypads, mice or other pointing devices, etc.), and a communication interface 514 (e.g., wireless network interface). The communication interface 514 allows software and data to be transferred between the controller 116 and external devices via a link. The controller 116 may also include a communications infrastructure 516 (e.g., a communications bus, cross-over bar, or network) to which the aforementioned devices/modules are connected.

Information transferred via communications interface 514 may be in the form of signals such as electronic, electromagnetic, optical, or other signals capable of being received by communications interface 514, via a communication link that carries signals and may be implemented using wire or cable, fiber optics, a phone line, a cellular phone link, a radio frequency link, and/or other communication channels. With such a communications interface, it is contemplated that the one or more processors 502 might receive information from a network, or might output information to the network in the course of performing the above-described method steps. Furthermore, method embodiments may execute solely upon the processors or may execute over a network such as the Internet, in conjunction with remote processors that share a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

It should be understood that while the present application is described in the context of various deposition tools, by no means this be construed as limiting. On the contrary the ESC pedestal 120 as described herein may be used in a wide variety of substrate processing tools, including but not limited to, lithography tools, plasma etching or chemical etching tools, ion implantation tools, substrate cleaning tools, etc.

Although only a few embodiments have been described in detail, it should be appreciated that the present application may be implemented in many other forms without departing from the spirit or scope of the disclosure provided herein. For instance, the substrate can be a semiconductor wafer, a discrete semiconductor device, a flat panel display, or any other type of work piece.

Therefore, the present embodiments should be considered illustrative and not restrictive and is not to be limited to the details given herein, but may be modified within the scope and equivalents of the appended claims.

What is claimed is:

1. An ElectroStatic Chuck (ESC), comprising a pedestal having a chucking surface arranged to chuck a substrate, wherein the electrostatic chuck is configured to generate electrostatic force at the chucking surface to clamp the substrate, wherein the chucking surface has a multi-layered coating comprising a top layer of silicon oxide and a bottom layer of silicon nitride or vice versa, wherein a material of an entirety or substantial entirety of the top layer is different from a material of an entirety or substantial entirety of the bottom layer, and wherein the multi-layered coating reduces charge traps in the chucking surface, wherein the multi-layered coating has a thickness ranging from 50 nanometers to 30 microns, wherein the ESC is further arranged to operate within a substrate processing chamber maintained at an elevated temperature such that an electrical conductivity of the silicon oxide or silicon nitride is increased to a level where the chucking surface generates sufficient electrostatic force to clamp the substrate.

2. The ESC of claim 1, wherein the multi-layered coating comprises the top layer of silicon oxide and the bottom layer of silicon nitride.

3. The ESC of claim 1, wherein the multi-layered coating comprises the top layer of silicon nitride and the bottom layer of silicon oxide.

4. The ESC of claim 1, wherein the chucking surface on which the multi-layered coating is formed comprises a dielectric over an electrode.

5. The ESC of claim 1, further arranged to operate, when the substrate is chucked to the chucking surface within a substrate processing chamber, at a temperature ranging from 450 to 600 degrees C.

6. The ESC of claim 1, wherein the chucking surface with the coating of the silicon oxide or the silicon nitride includes one or more minimum contact areas formed on the chucking surface.

7. The ESC of claim 1, wherein the ESC is either a Coulombic type ESC or a Johnsen-Rahbek (J-R) type ESC.

* * * * *